(12) United States Patent
Cho

(10) Patent No.: US 6,518,807 B1
(45) Date of Patent: Feb. 11, 2003

(54) MIXED DELAY LOCKED LOOP CIRCUIT

(75) Inventor: Seong Ik Cho, Jeollabuk-do (KR)

(73) Assignee: Hynix Semiconductor Inc., Ich'on (KR)

(*) Notice: Subject to any disclaimer, the term of this patent is extended or adjusted under 35 U.S.C. 154(b) by 0 days.

(21) Appl. No.: 10/026,463

(22) Filed: Dec. 27, 2001

(30) Foreign Application Priority Data

Sep. 20, 2001 (KR) .................................... 2001-0058152

(51) Int. Cl.[7] ................................................ H03L 7/06
(52) U.S. Cl. .............................. 327/158; 331/DIG. 2; 375/373
(58) Field of Search ................................ 327/141, 142, 327/144–150, 152–159, 161; 331/DIG. 2; 375/373, 376

(56) References Cited

U.S. PATENT DOCUMENTS

| | | | |
|---|---|---|---|
| 5,781,055 A | * 7/1998 | Bhagwan | 327/158 |
| 6,069,507 A | 5/2000 | Shen et al. | |
| 6,101,197 A | 8/2000 | Keeth et al. | |
| 6,222,406 B1 | 4/2001 | Noda et al. | |
| 6,242,955 B1 | * 6/2001 | Shen et al. | 327/158 |
| 6,292,016 B1 | * 9/2001 | Jefferson et al. | 326/39 |
| 6,337,590 B1 | * 1/2002 | Millar | 327/156 |
| 6,392,456 B1 | * 5/2002 | Pyeon et al. | 327/147 |

FOREIGN PATENT DOCUMENTS

| | | | |
|---|---|---|---|
| JP | 2000-21165 | 1/2000 | ......... G11C/11/407 |
| JP | 2000-22530 | 1/2000 | ............. H03L/7/16 |
| JP | 2001-23367 | 1/2001 | ............. G11C/7/00 |

* cited by examiner

Primary Examiner—My-Trang Nu Ton
(74) Attorney, Agent, or Firm—Jacobson Holman PLLC

(57) ABSTRACT

A mixed delay locked loop circuit comprises a digital delay unit and an analog delay unit. The digital delay unit has a digital half delay line comprising a plurality of unit delays, for comparing phases of an inputted external reference clock signal and an output clock signal generated by the mixed DLL circuit to control the delay length of the reference clock signal in the digital half delay line and locking control on the digital half delay line if locking is accomplished between the reference clock signal and the output clock signal. The analog delay unit has an analog delay line, for comparing phases of the reference clock signal and the output clock signal and converting the result into analog signal and then, controlling the delay length of the output signal of the digital half delay line in the analog delay line by using the analog signal.

17 Claims, 1 Drawing Sheet

MIXED DELAY LOCKED LOOP CIRCUIT

BACKGROUND OF THE INVENTION

Field of the Invention

The present invention relates to a mixed delay locked loop (DLL) circuit, and more particularly, to a circuit synchronizing an external reference signal and an output clock signal.

Whether a divisional clock signal is leading a reference signal or lagging behind the reference signal, it is an essential problem that a clock regeneration system is provided to a semiconductor memory device for stabilized locking within a short time in a high-speed computer. The regeneration is performed in all parts of the computer in order that all regenerated clock signals are generated with a minimum skew. Further, high resolution, rapid locking time and large frequency range are required in a graphic application such as pixel clock generation. Still further, a DDR DRAM circuit requires a minimum phase delay time less than ½ period of the reference signal.

A DLL circuit has been proposed as a method of solving the timing problem of an electric system. In particular, a projector can monitor a phase difference between the reference signal and the internal clock signal, related to the reference signal, using a DLL circuit. The phase difference between the reference signal and the internal clock signal causes a problem of response delay corresponding to the semiconductor memory device. As a result, the DLL has been employed to align the reference signal with the internal clock signal.

There are three types of DLL: digital, analog and mixed type. The mixed type DLL is disclosed in U.S. Pat. No. 6,242,955 B1 (Assignee: Silicon Magic Corporation, Appl.No.: 09/399,116, Filed: Sep. 20, 1999). As disclosed in the patent gazette, the mixed type DLL has advantages of rapid locking time, large frequency range and high resolution. However, it has a disadvantage that one cycle delay line is required to cover clock frequency to be employed. When one cycle delay line is employed, the delay shift is greatly increased as the result of noise. Further, power consumption and required range are also increased due to the delay line.

In digital DLL, movement caused by noise after locking is moved by unit delay since the delay line comprises unit delays. Therefore, there is a problem of large clock jitter.

SUMMARY OF THE INVENTION

Therefore, the present invention has been proposed in order to solve the above problems and an object of the present invention is to provide a DLL circuit wherein the delay shift is not greatly increased as the result of noise.

Another object of the present invention is to provide a DLL circuit having low power consumption and required range.

Still another embodiment of the present invention is to provide a DLL circuit wherein clock jitter is not greatly increased by movement as the result of noise after locking.

In order to accomplish the objects, the present invention comprises a mixed DLL circuit that includes a digital delay unit and analog delay unit. The digital delay unit has a digital half delay line comprising a plurality of unit delays, comparing phases of a reference clock signal inputted from the external and output clock signal generated by the mixed delay locked loop circuit to control delay time of the reference clock signal in the digital half delay line and to lock control on the digital half delay line when locking is accomplished between the reference clock signal and the output clock signal. The analog delay unit has an analog delay line, comparing phases of the reference clock signal and the output clock signal and converting the result into an analog signal and then, controlling the delay time of the output signal of the digital half delay line in the analog delay line by using the analog signal. It is desirable that the mixed DLL circuit further comprises an input buffer for generating and outputting a first internal clock signal having a signal level suitable for the mixed delay locked loop circuit and a second internal clock signal having a phase difference of 180° with the first internal clock signal by using the reference clock signal.

In addition to the digital half delay line, the digital delay unit further comprises: a first phase comparator for outputting a first phase comparison signal comparing phases of the first internal clock signal and the output clock signal and indicating the result; a first delay controller for generating a first delay control signal inputting the first phase comparison signal to control delay time in the digital half delay line; and a locking detector for inputting the first phase comparison signal and locking the first delay control signal if it is determined that the first internal clock signal and the output clock signal are locked. The first delay controller has a counter operating according to the first phase comparison signal, the counter being locked if it is determined that the first internal clock signal and the output clock signal are locked by the locking detector. One internal clock signal of the first internal clock signal and the second internal clock signal is selectively provided to the digital half delay line according to the first phase comparison signal and the output signal of the analog delay line is provided as the output clock signal of the mixed delay locked loop circuit.

In addition to the analog delay line, the analog delay unit further comprises: a second delay controller for comparing the phases of the reference clock signal and the output clock signal and outputting a second phase comparison signal indicating the result; and a digital/analog converter for converting the second phase comparison signal into an analog signal and providing the signal to the analog delay line to control the analog delay line.

According to the present invention, the delay line is shortened, thereby reducing the delay shift cuased by noise. Further, it has the advantages that power consumption and required range are also reduced and clock jitter is not greatly increased as the result of noise after locking.

DETAILED DESCRIPTION OF THE INVENTION

Figure 1:
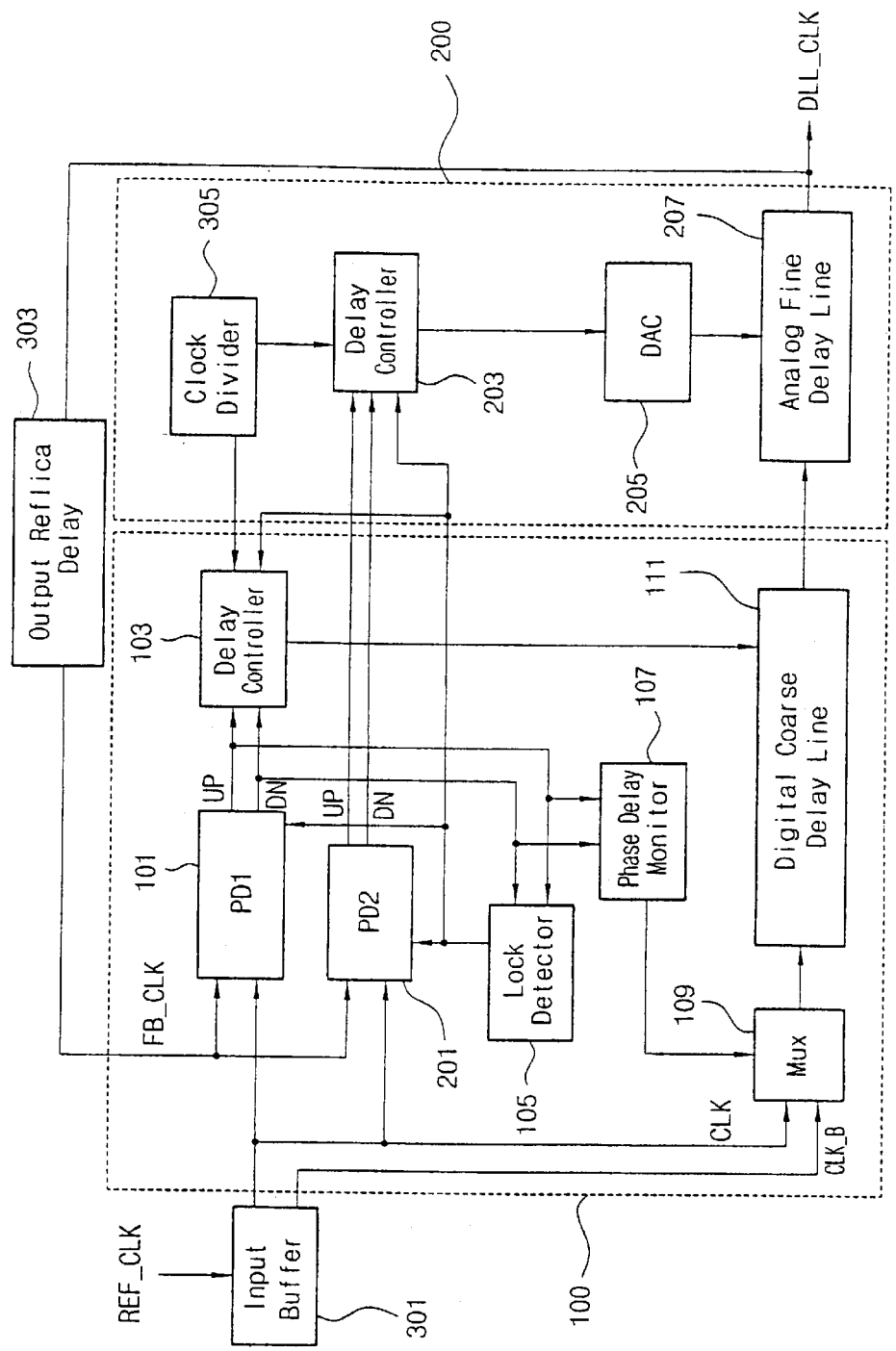
FIG. 1 is a drawing showing the structure of a mixed delay locked loop circuit according to the present invention.

The above objects, and other features and advantages of the present invention will become more apparent after reading the following detailed description when taken in conjunction with the drawings.

FIG. 1 is a block diagram of a mixed DLL having a half delay line according to the present invention. Referring to FIG. 1, the present invention includes a digital delay unit 100 and an analog delay unit 200. The digital delay unit 100 comprises a phase detector 101, a delay controller 103, a locking detector 105, a phase delay monitor 107, a MUX 109 and a digital delay line 111. The analog delay unit 200 comprises a phase detector 201, a delay controller 203, a digital/analog converter 205 and an analog fine delay line 207. In FIG. 1, the phase detector 201 is a component of the analog delay unit 200 although it is shown as included in the digital delay unit 100. Additionally, the present invention further comprises an input buffer 301, an output replica delay 303 and a clock frequency divider 305. In FIG. 1, REF_CLK indicates an external inputted reference clock signal, DLL_CLK a clock signal generated by the mixed DLL circuit according to the present invention, FB_CLK a clock signal which is obtained by feedback of DLL_CLK to the first phase detector 101 and the second phase detector 201 through the output replica delay 303, CLK an output clock signal of the input buffer 301, and CLK_B is another output clock signal of the input buffer 301, phase-shifted by 180° from CLK.

In the digital delay unit 100, firstly, the phase detector 101 compares the phase difference between the output signal CLK of the input buffer 301 and the feedback signal FB_CLK to generate up signal UP or down signal DN. The output signal of phase detector 101 is provided to the delay controller 103, the locking detector 105 and the phase delay monitor 107. The delay controller 103 has a counter (not shown) storing the delay length in the digital delay line 111, changing the counter value according to the output signal of phase detector 101. The locking detector 105 inputs the up signal UP or the down signal DN from the phase detector 101 to determine whether locking is accomplished between the internal clock signal CLK and the feedback clock signal FB_CLK and to lock the counter of the inner part of the delay controller 103 after checking that two clock signals are locked. The phase delay monitor 107 determines whether a half delay is accomplished to the frequency range of the clock signal by using the output signal of the phase detector 101. The MUX 109 is employed as a switch for selectively providing a first internal clock signal CLK or a second internal clock signal CLK_B phase-shifted by 180° from the internal clock signal to the digital delay line 111 according to the output signal of phase delay monitor 107. The digital delay line 111 comprises a unit delay, delaying a clock signal provided through the MUX 109 for a predetermined time to provide to the analog delay line 207 of the analog delay unit 200.

Then, in the analog delay unit 200, the phase detector 201 generates an up signal UP or a down signal DN by comparing the phase difference of the first internal clock signal CLK and the feedback clock signal FB_CLK and then, provides the signal to the delay controller 203. The delay controller 203 has a counter (not shown) storing the delay length in the analog delay line 207, changing the counter value according to the output of the phase detector 203. The digital/analog converter 205 converts the counter value of the delay controller 203 into the current amount of analog signal.

Further, an external reference clock signal REF_CLK is inputted to the input buffer 301 and is converted by the input buffer 301 into a signal level suitable for the DLL circuit. The output replica delay 303 performs a feedback to the internal clock signal DLL_CLK generated by the DLL circuit and provides it to phase detectors 101, 201. The clock frequency divider 305 appropriately divides the frequency of the reference clock signal and provides it to delay controllers 103, 203, thereby operating counters in delay controllers 103, 203.

In FIG. 1, the digital delay unit 100 controls a digital delay line comprising a unit delay by using a digital method, thereby delaying the external reference signal REF_CLK provided through the input buffer 301 with coarse accuracy. The analog delay unit 200 finely controls the analog delay line by using an analog method after locking the digital delay unit 100, thereby delaying the output signal of digital delay line 111 with high accuracy.

That is, the phase detector 101 of digital delay unit 100 compares the external clock signal CLK and the feedback clock signal FB_CLK to determine UP/HOLD/DOWN. The desirable range of external reference clock signal REF_CLK should be covered only by a half delay line and unit delay should be selected through the delay controller 103 in the digital delay line comprising a unit delay from the beginning. Therefore, the phase delay monitor 107 determines the UP/DOWN signal of the phase detector 101 to select the first internal clock signal CLK or the second internal clock signal CLK_B. The delay controller 103 checks the numbers of up signal and down signal in order to increase or decrease the coarse delay according to the output signal of the phase detector 101. The locking detector 105 senses the HOLD state of the output of the phase detector 101 and stops the delay controller 103. Then, if the digital delay unit 100 maintains a lock state, it has as much jitter as unit delay. Therefore, fine tuning is performed to the jitter of the unit delay by operation of analog delay unit 200.

After the delay controller 103 is locked by the locking detector 105 of digital delay unit 200, the phase detector 201 compares the clock signal CLK and the feedback signal FB_CLK and determines UP/DOWN in order to finely tune the delay. The delay controller 203 checks the numbers of UP or DN by using an internal counter (not shown) in order to increase or decrease the delay according to the output signal of the phase detector 201. The digital/analog converter 205 converts the counter value of delay controller 203 into the current value of the analog signal. According to the current control of the digital/analog converter 205, fine delay is controlled.

As described above, according to the present invention, a delay line is shortened, thereby reducing the delay shift resulting from noise. Further, the present invention has the advantages that power consumption and required range are also reduced and clock jitter caused by noise is not great after locking.

What is claimed is:

1. A mixed DLL circuit comprising:
   a digital delay unit having a digital half delay line comprising a plurality of unit delays, for comparing phases of an inputted external reference clock signal and an output clock signal generated by the mixed DLL circuit to control delay time of the reference clock signal in the digital half delay line to lock control on the digital half delay line if locking is accomplished between the reference clock signal and the output clock signal; and
   an analog delay unit having an analog delay line, for comparing phases of the reference clock signal and the output clock signal and converting the result into an analog signal to control the delay length of the output signal of the digital half delay line in the analog delay line by using the analog signal.

2. The mixed DLL circuit according to claim 1, further comprising an input buffer for generating and outputting a first internal clock signal having a signal level suitable for the mixed DLL circuit and a second internal clock signal having a phase difference of 180° with the first internal clock signal, by using the reference clock signal.

3. The mixed DLL circuit according to claim 2, wherein the digital delay unit further comprises:

a first phase comparator for comparing phases of the first internal clock signal and the output clock signal to output a first phase comparison signal indicating the result;

a first delay controller for inputting the first phase comparison signal to generate a first delay control signal controlling the delay length in the digital half delay line; and a locking detector for inputting the first phase comparison signal to lock the first delay control signal if it is determined that the first internal clock signal and the output clock signal are locked.

4. The mixed DLL circuit according to claim 3, wherein the first delay controller has a counter operating according to the first phase comparison signal, the counter being locked if it is determined that the first internal clock signal and the output clock signal are locked by the locking detector.

5. The mixed DLL circuit according to claim 3, wherein the one internal clock signal of the first internal clock signal and the second internal clock signal is selectively provided to the digital half delay line according to the first phase comparison signal and the output signal of the analog delay line is provided as an output clock signal of the mixed DLL circuit.

6. The mixed DLL circuit according to claim 1, wherein the analog delay unit further comprises:

a second delay controller for comparing phases of the reference clock signal and the output clock signal to output a second phase comparison signal indicating the result; and a digital/analog converter for converting the second phase comparison signal into the analog signal and providing the signal to the analog delay line in order to control the analog delay line.

7. The mixed DLL circuit according to claim 1, further comprising a clock frequency divider for dividing the frequency of the reference clock signal and providing the signal to the first delay controller and the second delay controller.

8. The mixed DLL circuit according to claim 1, further comprising an output replica delay for feedback of the output clock signal to a first phase delay and a second phase delay.

9. The mixed DLL circuit comprising:

a digital half delay line comprising a plurality of unit delays, for delaying an inputted external clock signal for a predetermined time by using a digital method;

a first phase comparator for comparing phases of the inputted external clock signal and an output clock signal generated by the DLL to output a first phase comparison signal indicating the result;

a first delay controller for inputting the first phase comparison signal to generate a first delay control signal controlling the delay length in the digital half delay line and then, providing the signal to the digital half delay line;

a locking detector for inputting the first phase comparison signal to lock the first delay control signal if it is determined that a first internal clock signal and the output clock signal are locked;

an analog delay line for delaying the output signal of the digital half delay line for a predetermined time by using an analog method;

a second delay controller for comparing phases of the inputted external clock signal and the output clock signal to output a second phase comparison signal indicating the result; and a digital/analog converter for converting the second phase comparison signal into an analog signal and providing the signal to the analog delay line in order to control the analog delay line.

10. The mixed DLL circuit according to claim 9, wherein the first delay controller has a counter operating according to the first phase comparison signal, the counter being locked if it is determined that the inputted external clock signal and the output clock signal are locked by the locking detector.

11. The mixed DLL circuit according to claim 9, further comprising an input buffer for generating the first internal clock signal having a signal level suitable for the mixed DLL circuit and a second internal clock signal having a phase difference of 180° with the first internal clock signal and then, providing the first internal clock signal to the first and the second phase comparators and providing the first and the second internal clock signals to the digital half delay line.

12. The mixed DLL according to claim 11, wherein one internal clock signal of the first and the second internal clock signals is selectively provided to the digital half delay line according to the first phase comparison signal.

13. The mixed DLL according to claim 9, further comprising a clock frequency divider for dividing the frequency of the inputted external clock signal and providing the signal to the first delay controller and the second delay controller.

14. The mixed DLL circuit according to claim 9, further comprising- an output replica delay for feedback of the output clock signal to a first phase delay and a second phase delay.

15. A method of synchronizing an output clock signal generated to an inputted external reference clock signal, comprising the steps of:

generating a first phase comparison signal by comparing phases of the reference clock signal and the output clock signal and controlling the delay time of the reference clock signal in the digital half delay line comprising a plurality of unit delays by using the first phase comparison signal;

locking control on the half delay line if locking is accomplished between the reference clock signal and the output clock signal;

generating a second phase comparison signal by comparing phases of the reference clock signal and the output clock signal and converting the second phase comparison signal into an analog signal; and controlling the delay time of the output signal of the half delay line in the analog delay line by using the analog signal.

16. The method of synchronizing an output clock signal according to claim 15, further comprising the steps of generating and outputting a first internal clock signal having a signal level suitable for the digital half delay line and a second internal clock signal having a phase difference of 180° with the first internal clock signal by using the reference clock signal.

17. The mixed DLL circuit according to claim 16, wherein one internal clock signal of the first and the second internal clock signals is selectively provided to the digital half delay line according to the first phase comparison signal.

* * * * *